US007005651B2

(12) United States Patent
Kaga et al.

(10) Patent No.: US 7,005,651 B2
(45) Date of Patent: Feb. 28, 2006

(54) LIQUID METAL ION GUN

(75) Inventors: Hiroyasu Kaga, Mito (JP); Yuichi Madokoro, Hitachinaka (JP); Shigeru Izawa, Mito (JP); Tohru Ishitani, Hitachinaka (JP); Kaoru Umemura, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 11/004,903

(22) Filed: Dec. 7, 2004

(65) Prior Publication Data

US 2005/0127304 A1   Jun. 16, 2005

(30) Foreign Application Priority Data

Dec. 8, 2003   (JP) .............................. 2003-409352

(51) Int. Cl.
   *G21G 5/00*    (2006.01)
   *H01J 27/00*   (2006.01)
(52) U.S. Cl. ............................. 250/423 R; 250/423 F; 250/424; 313/360.1; 313/362.1; 313/363.1
(58) Field of Classification Search .................... None
See application file for complete search history.

(56) References Cited

U.S. PATENT DOCUMENTS

| 4,426,582 | A | * | 1/1984 | Orloff et al. ......... 250/396 ML |
| 5,034,612 | A |   | 7/1991 | Ward et al. |
| 6,265,722 | B1 | * | 7/2001 | Marsh ..................... 250/423 F |
| 6,429,439 | B1 | * | 8/2002 | Marsh ..................... 250/423 F |
| 6,710,338 | B1 | * | 3/2004 | Gerlach et al. ............. 250/309 |
| 2001/0035499 | A1 | * | 11/2001 | Marsh ..................... 250/423 F |
| 2005/0127304 | A1 | * | 6/2005 | Kaga et al. ............. 250/423 R |

FOREIGN PATENT DOCUMENTS

| JP | 3-149732 |   | 6/1991 |
| JP | 4-14455 | A | 1/1992 |
| JP | 5-159730 |   | 6/1993 |
| JP | B2-2952508 |   | 7/1999 |
| JP | B2-3190395 |   | 5/2001 |
| JP | 2001-160369 | A | 6/2001 |

* cited by examiner

*Primary Examiner*—John R. Lee
*Assistant Examiner*—Bernard E. Souw
(74) *Attorney, Agent, or Firm*—McDermott Will & Emery LLP

(57) ABSTRACT

An emitter of a Ga liquid metal ion source is constituted to include W12 of a base material and Ga9 of an ion source element covering a surface as construction materials. By making back-sputtered particles become elements (W and Ga) of the Ga liquid metal ion source, if back-sputtered particles attach to the Ga liquid metal ion source, contamination which may change physical characteristics of Ga9 does not occur. A W aperture is used as a beam limiting (GUN) aperture to place Ga of approx. 25 mg (of melting point of 30° C.) on a surface of a portion included in a beam emission region (Ga store). When emitting ions to the beam limiting (GUN) aperture, Ga in the emission region melts and diffuses on a surface of the beam emission region of the W aperture.

8 Claims, 4 Drawing Sheets

2-1. Ga LIQUID METAL ION SOURCE

LIQUID METAL ION GUN

BACKGROUND OF THE INVENTION

1. Field of the Invention

The present invention relates to a liquid metal ion source (LMIS), and more particularly to an art of making the ion emission of a Ga liquid metal ion source stable and long life time.

2. Description of the Prior Art

A liquid metal ion gun includes a vacuum chamber in which a liquid metal ion source is set, and the liquid metal ion source electrically insulated from the vacuum chamber. A high voltage cable capable of supplying current between both terminals of the liquid metal ion source is connected to the liquid metal ion gun and thereby, it is possible to supply a high voltage to the liquid metal ion source so as to apply the high voltage to the liquid metal ion source appropriately and to heat the liquid metal ion source by turning on electricity.

It is possible to adjust an ion emission quantity (emission current) by voltage between the liquid metal ion source and an extract electrode. The emitted ions are received by a beam limiting aperture (gun aperture).

It is important to stably maintain the ion emission of the above Ga liquid metal ion source. However, in order to do so, it is necessary to stably supply gallium (hereafter referred to as "Ga") consumed by the ion emission, from a reservoir. A condition in which the emission current is stable is a condition in which consumption of Ga is balanced with supply of Ga, that is, a balance equilibrium eutectic condition in which Ga is supplied by an amount as consumed for the ion emission.

However, if a foreign material is mixed into Ga, the supply of Ga may be interrupted, and if the purity of Ga is changed, physical properties are changed to lose the balance between the consumption and the supply of Ga. Accordingly, the stability of emission becomes deteriorated.

In order to obtain stable emission, it has been constructed conventionally such that an emission ion beam is hot directly irradiated onto an extractor electrode so as not to admix a foreign material into Ga. Further, an electrode (beam limiting aperture) receiving emission of a beam is constituted by a chemical compound metal of Ga which does not interrupt supply of Ga even if Ga is subjected to a buildup of a contaminating material due to adhesion of back-sputtered particles of the electrode receiving emission of the emission ion beam to Ga, that is, a metal (Sn or In) not raising the melting point of Ga.

Furthermore, because the number of back-sputtered particles (or particles causing contamination) to be re-adsorbed to LMIS is decreased proportionally to the square of the distance between the emitter and the beam limiting aperture, the distance between the emitter and the beam limiting (GUN) aperture has been separated.

For example, Japanese Patent Publication No. 3190395 discloses a technique for constituting a portion irradiated with an ion beam by a sintered body in which a low-melting-point metal is infiltrated. JP-A-2001-160369 discloses a technique for, when using common Ga as a liquid metal ion source, using the same kind of Ga as a restricting material for protection. In addition, JP-A-4-14455 discloses that a surface of an emitter electrode or the emitter electrode is constituted by one or more of melted metals set to a tip end of the emitter electrode or metals constituting an alloy.

BRIEF SUMMARY OF THE INVENTION

However, there is no mention about limitation of a construction material (base material) of an aperture in each of the above prior arts. Therefore, when the construction material (base material) of a beam limiting aperture is exposed by receiving ion emission, a change of emission stability due to the fact that the base material is sputtered to be mixed in a liquid metal source is not considered.

Even if using the above technique, it is difficult to return the emission which becomes unstable as a result of stably maintaining the emission for a long time to a stable state in a liquid metal ion source preferable to be used for hundreds of hours or more. That is, the difficulty of recovery when emission becomes unstable has not been considered.

Moreover, when desiring to realize a focused ion beam system for a high-current and high-angular-intensity processing beam, it is not preferable to greatly increase the distance between an emitter and a beam limiting aperture. However, if considering the life time of contamination and the beam limiting aperture, it is better to increase the distance between the emitter and the beam limiting aperture. That is, it is found that improving the performance of the focused ion beam system and decreasing the contamination of the emitter are in trade-off relation with each other.

Since a beam limiting aperture is constructed to receive the whole emission current (2 to 3 $\mu$A) of an ion source, the beam limiting aperture becomes thin by sputtering as the ion emission time (=the emission current×the operating time) increases, so that the aperture becomes expanded. When the expansion of the aperture is started, the beam current at the downstream side of the beam limiting aperture increases, and at the same time, a lower electrode is exposed, so that back-sputtered particles include particles from a lower electrode other than those from the beam limiting aperture. It is general that the material of the lower electrode is different from that of the beam limiting aperture. When the back-sputtered particles attach to an emitter, the back-sputtered particles from the lower electrode do not melt in Ga. Even if the particles melt in Ga, the melting point of the Ga rises to prevent the supply of Ga.

Also when constituting the beam limiting aperture from In or Sn metal, there is a problem that the back-sputtered particles attach to the emitter to deteriorate the purity of Ga. If the admixture of In or Sn is up to approx. 10 wt %, the melting point of Ga is lowered. However, if the purity of Ga is decreased as a result of accumulation of Sn or In due to long time use so that the emitter performance is changed, the supply state of Ga is changed to vary emission.

Hereinafter, problems of a general liquid metal ion gun are more specifically described by referring to FIG. 3. As shown in FIG. 3, the ion gun has a Ga liquid metal ion source 2-1, an extractor electrode 2-2 for allowing ions to be discharged, and a beam limiting aperture 2-3. The extractor electrode 2-2 is made of SUS and has an aperture of $\phi$3 mm and an aperture-side wall of a thickness of 1 mm. The distance between a tip end of an emitter and the extractor electrode 2-2 is 0.8 mm. The extractor electrode 2-2 has a structure in which an emission ion beam 7 from the liquid metal ion source 2-1 is not directly applied to the extractor electrode 2-2. The extractor electrode 2-2 includes the beam limiting aperture (GUN) 2-3 therein, and an aperture of $\phi$0.3 mm 2-31 is formed on the extractor electrode 2-2. An aperture made of Sn and having a thickness of 3 mm is set downward by 5 mm from an upper surface of the extractor electrode 2-2.

The beam limiting aperture 2-3 operates as a restrictor for limiting beam emission. The extractor electrode 2-2 has a function of applying a voltage between an emitter and the extractor electrode (a space between the emitter and the upper surface of the extractor electrode) to emit the ions. The extractor electrode 2-2 and the beam limiting aperture 2-3 are constituted so that the beam limiting aperture 2-3 is assembled into the extractor electrode 2-2. Although the aperture 2-3 and the electrode 2-2 have the same electric potential, the functions thereof are different.

When providing a voltage difference of approx. 7 kV between the Ga liquid metal ion source 2-1 and the extractor electrode 2-2, Ga+ ions are discharged from the Ga liquid metal ion source 2-1 and applied onto the beam limiting (GUN) aperture 2-3 made of Sn. The beam limiting aperture 2-3 made of Sn is sputtered by the Ga+ ions, so that Sn atoms (back-sputtered particles 11) are scattered, and some of the atoms are scattered and adsorbed by the Ga liquid metal ion source 2-1.

Further, when the sputtering by the Ga+ ions is advanced, the beam limiting (GUN) aperture 2-3 is decreased in thickness and increased in aperture diameter, and thereby the beam limiting aperture 2-3 expires in its life time. If using the beam limiting aperture 2-3 beyond its life time, the lower electrode of the beam limiting aperture 2-3 is exposed, so that constituent atoms of the electrode material are scattered due to sputtering by the Ga+ ions, and some of the atoms are adsorbed by the Ga liquid metal ion source 2-1. The adsorbed substances make the melting point of Ga raise, or directly interrupt a Ga supply flow path to make emission unstable. If a beam limiting aperture is made of Sn, (the back-sputtered particles of Sn make a compound with Ga to melt in Ga, and the melting point becomes 30° C. or lower up to approx. 10 wt %) Sn adsorbed by the Ga liquid metal ion source is melted in Ga, and physical characteristics of Ga such as surface tension and a melting point are changed depending on the concentration of the solute.

For stable emission of ions, it is preferable that supply of Ga corresponds to the emission and is not changed over time. However, when the physical characteristics of Ga are changed, the balance point is changed, so that an emission current is also changed. Moreover, the emission current is also changed when the flow path of Ga is clogged to change the supply quantity of Ga. Therefore, in the case of the general configuration as shown in FIG. 3, it has been difficult to obtain stable emission for a long time, for example, for hundreds of hours.

In view of the above-described problems, objects of the present invention are described blow. That is, an object is to stabilize emission for a long time even if the distance between an emitter and a beam limiting aperture is small. In addition, an object is to extend the life time of a beam limiting aperture even if receiving sputtering by beam emission. Further, an object is, when the emission of the liquid metal ion source becomes unstable, to recover the emission in a stable state at high reproducibility to use a liquid metal ion source for a long time to lengthen the life time thereof. Furthermore, an object is to provide a stable liquid metal ion gun not requiring beam adjustment of a focused ion beam system.

According to a first aspect of the invention, there is provided a liquid metal ion gun comprising: a liquid metal ion source having a liquid metal ion element made of a first metal substrate, a reservoir formed by as second metal substrate for holding the liquid metal ion element, and an emitter formed by the second metal substrate; and a beam limiting aperture formed by a third metal substrate, the beam limiting aperture having an aperture for limiting emission of an ion beam extracted from the liquid metal ion source, wherein the third metal substrate is formed by a material including the metal substrates constituting the first metal substrate and the second metal substrate, respectively. By using this liquid metal ion gun, it is possible to decrease the number of factors of contaminating the emitter. The third metal substrate constituting the beam limiting aperture may be constituted only by the first metal substrate and the second metal substrate. Also, the ion gun may be provided with an acceleration mechanism.

Further, in a liquid metal ion gun comprising: a liquid metal ion source having a liquid metal ion element made of a first metal substrate, a reservoir formed by as second metal substrate for holding the liquid metal ion element, and an emitter formed by the second metal substrate; and a beam limiting aperture formed by a third metal substrate, the beam limiting aperture having an aperture for limiting emission of an ion beam extracted from the liquid metal ion source, it is preferable that the beam limiting aperture is formed by a material including the second metal substrate, and a supply source of the first metal substrate is arranged in at least a part of a region to which the ion beam is substantially emitted. By this features, it is possible to easily reduce the above contamination factors.

According to the invention, in fabrication by a large current beam of a focused ion beam apparatus or the like provided with a liquid metal ion source, it is possible to perform the fabrication with no damage due to the ion emission around the fabrication. According to the liquid metal ion gun of the invention, in a liquid metal ion source having a purpose of using for several hundreds hours or more, it is superior in point of stably maintaining emission for a long time, and in point of securely recovering unstable emission into a stable state, that is, superior in easiness and reproducibility of recovery of emission stability.

Other objects, features and advantages of the invention will become apparent from the following description of the embodiments of the invention taken in conjunction with the accompanying drawings.

DETAILED DESCRIPTION OF THE INVENTION

A liquid metal ion gun according to an embodiment of the present invention is described below by referring to the accompanying drawings. A liquid ion gun of the present invention relates to a liquid metal ion gun on which a liquid metal ion source and a beam limiting aperture for receiving emission of ions emitted from the liquid metal ion source are mounted.

Figure 1:
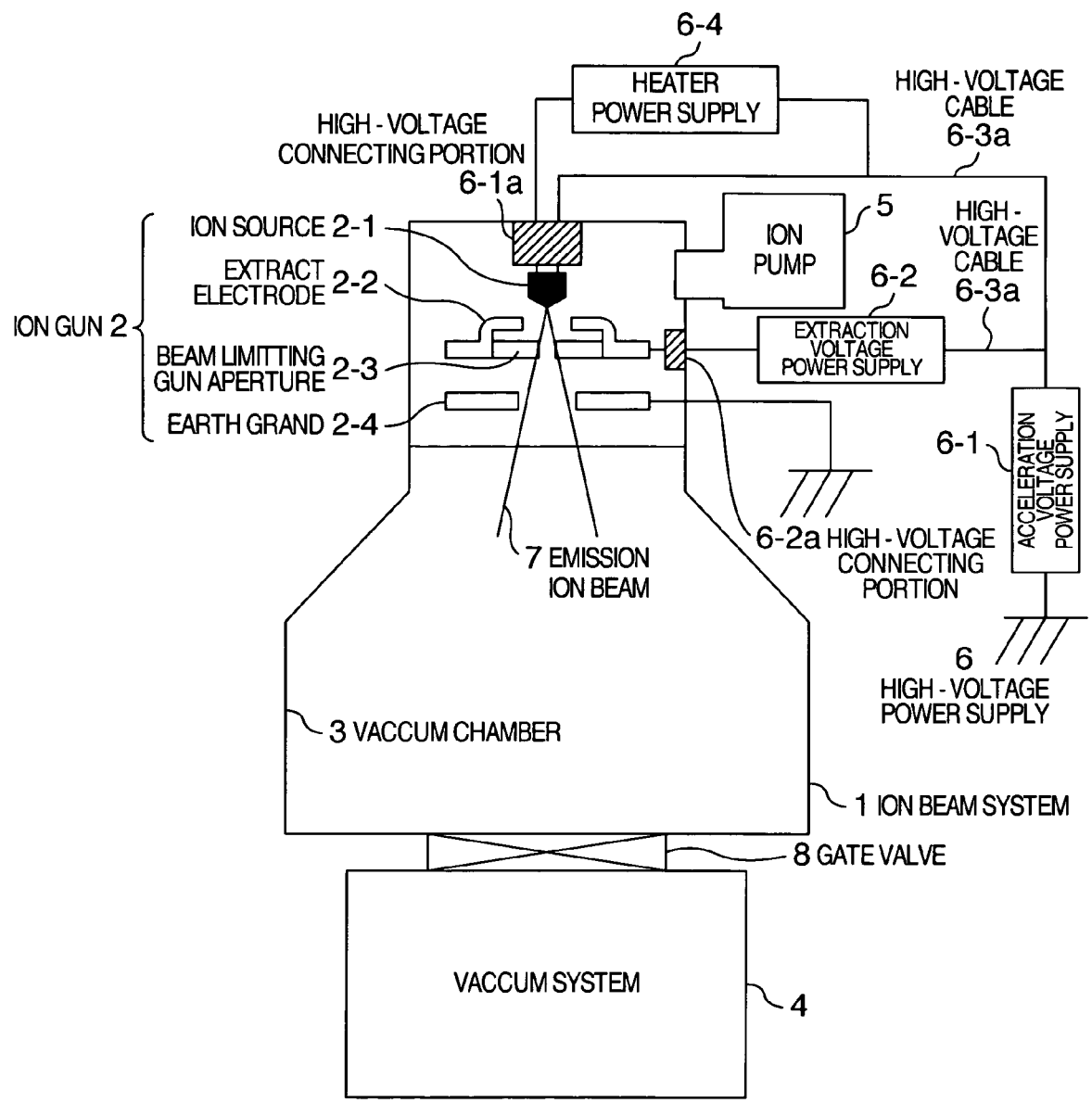
FIG. 1 is an illustration showing a configuration example of an ion beam apparatus according to an embodiment of the present invention.

Firstly, the whole configuration of an apparatus on which an ion gun according to an embodiment of the present invention is mounted is described below by referring to FIG. 1. FIG. 1 is a schematic configuration view of an ion beam system using a Ga liquid metal ion gun according to an embodiment of the present invention. In FIG. 1, reference numeral 1 denotes an ion beam system, and reference numeral 2 denotes an ion gun wherein reference numeral 2-1 denotes an ion source, reference numeral 2-2 denotes an extractor electrode, reference numeral 2-3 denotes a beam limiting aperture, reference numeral 2-4 denotes earth ground. Reference numeral 3 denotes a vacuum chamber, reference numeral 4 denotes a vacuum system, reference numeral 5 denotes an ion pump, and reference numeral 6 denotes a high-voltage power supply wherein reference numeral 6-1 denotes a high-voltage power supply for ion acceleration, reference numerals 6-1a and 6-2a denote high-voltage connecting portions, reference numeral 6-2 denotes a high-voltage power supply for extracting ions, reference numerals 6-3a and 6-3b denote high-voltage cables, reference numerals 6-4 denotes an ion-source heating power supply, reference numeral 7 denotes an emission ion beam, and reference numeral 8 denotes a gate valve provided between the vacuum chamber 3 and the vacuum system 4.

Main operations (functions) of this system are described below. An ion beam generated by being extracted from the ion source (emitter) 2-1 by the extractor electrode 2-2 passes through the beam limiting aperture 2-3 while diffusion of the beam is limited, and the beam having passed through the aperture 2-3 is applied to downstream side by being accelerated by the earth ground 2-4. In addition to the above configuration, by adding functions of thinly restricting a signal detection system for detecting a signal from an ion beam emission sample and an emission beam by a lens, and defection-controlling the beam to apply the beam to the sample, it is possible to form a process observation system.

Figure 2:
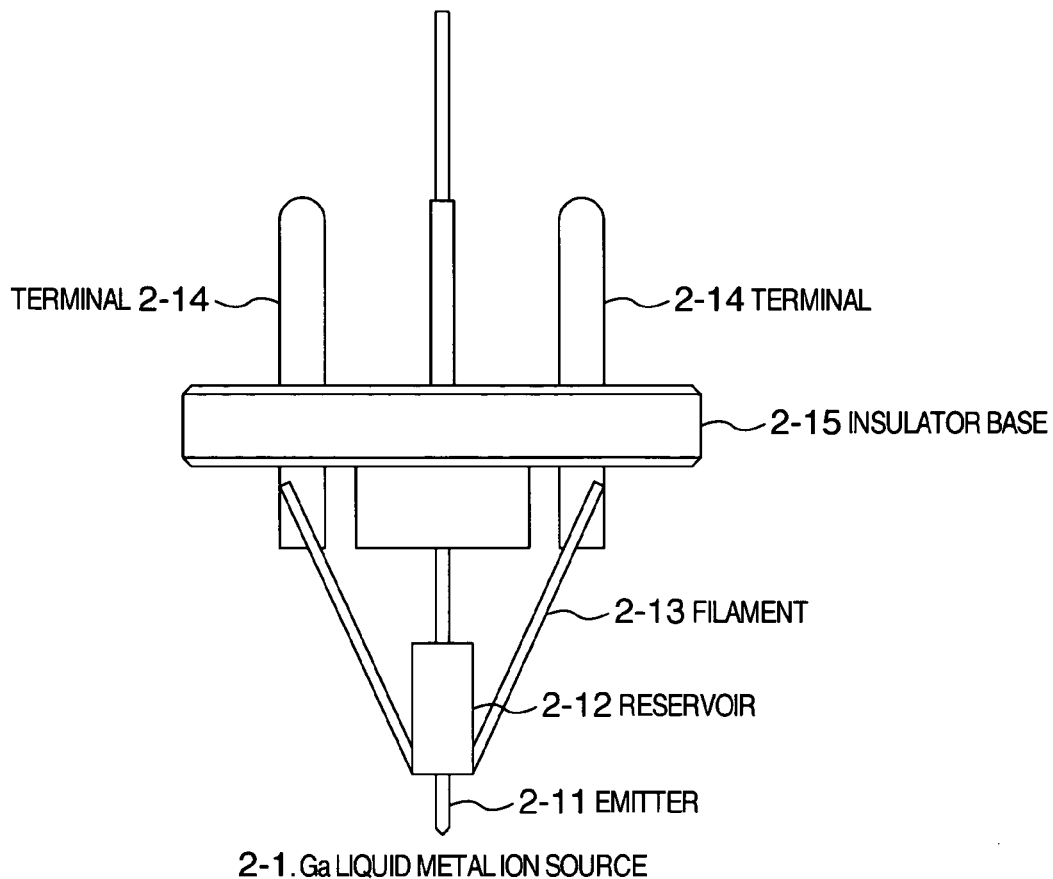
FIG. 2 is an illustration showing a configuration of a Ga liquid metal ion source.
Figure 3:
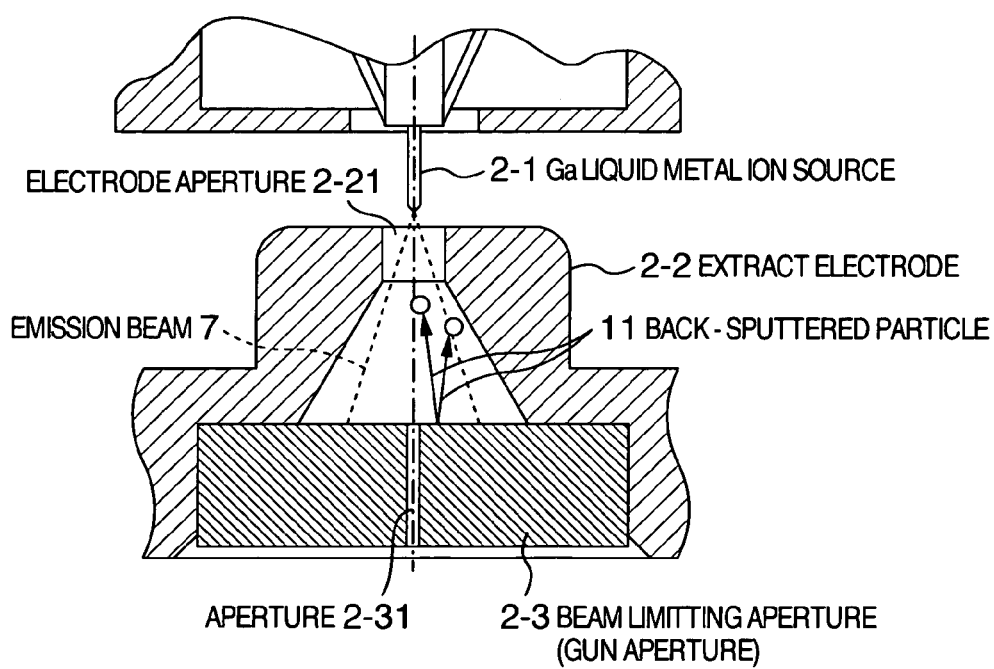
FIG. 3 is an illustration showing a general liquid metal ion gun.

Next, the configuration and principle of an LMIS are described below. FIG. 2 is an illustration showing the configuration of a liquid metal ion source. As shown in FIG. 2, the liquid metal ion source such as the Ga liquid metal ion source 2-1 has an needle emitter 2-11 of which tip end is conical, a reservoir 2-12 for storing Ga, a filament 2-13 for turning on power to heat the Ga stored in the reservoir 2-12 and the needle emitter 2-11, and an insulator base 2-15 for fixing a terminal 2-14 for supplying power to the filament 2-13.

The material of the needle emitter 2-11, reservoir 2-12, and filament 2-13 is tungsten (W), and Ga is contained in the reservoir 2-12. Thus, elements of a general Ga liquid metal ion source are W, Ga, and an insulator.

The operation principle about ion emission is that an axis-directional field gradient becomes stronger toward an apex since a tip end of the needle emitter has a conical shape. Ga at a portion near the apex of the needle emitter is supplied to the emitter apex having a strong electric field and is shaped in conical, by meand of an electric field stress. Since the apex of the liquid metal has thereby a strong electric field of approx. V/Å, ionized potential is lowered, so that field evaporation or field ionization occurs to easily cause ionization. Accordingly, in a high voltage electric field of approx. V/Å, ions are discharged into a vacuum so that an ion flow occurs.

In accordance with emission of ions, it is necessary to supply Ga corresponding to the discharged quantity of Ga ions. However, because Ga behaves in accordance with liquid flow dynamics, a pressure gradient occurs so that a surface flow of a continuous fluid is generated. Since this flow is in accordance with a Poiseuile's equation for flow due to surface tension, the flow rate of the flow is changed due to changes of the surface tension and viscosity.

In general, pure Ga has a good wetting of a clean tungsten substrate. For example, when a fine groove exists on tungsten, Ga is diffused through the groove due to the capillary phenomenon caused by surface tension. Further, a needle emitter generally uses a W material having a narrow vertical groove in the axis direction, and thereby it is possible to diffuse Ga in a reservoir through the groove by the capillary phenomenon due to the surface tension to supply Ga to a portion near the apex of the emitter. While the stable emission receives Ga corresponding to ion discharge, if surface tension is changed, the supply quantity is also changed so that the emission is varied.

Figure 4A:
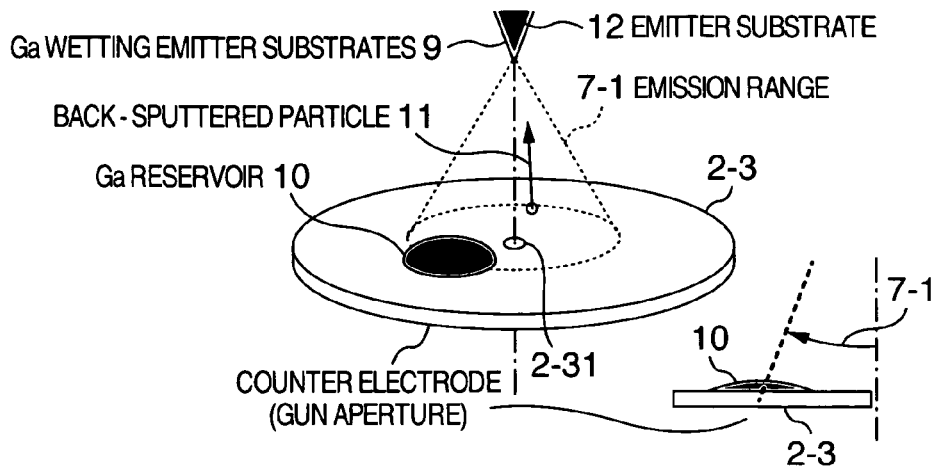
FIGS. 4A and 4B are illustrations showing a configuration example of a liquid metal ion gun in which a Ga store is arranged, according to an embodiment of the present invention.

In the liquid metal ion gun according to this embodiment, a Ga store (which may be referred to as a second Ga supply source if assuming the reservoir as a first Ga supply source) is provided as described below. This configuration is described by referring to FIG. 4A. As shown in FIG. 4A, the emitter 2-11 of the Ga liquid metal ion source 2-1 is constituted to include, as a construction material, W12 of a substrate and Ga9 of an ion source material covering a surface. In this case, by making back-sputtered particles 11 become elements (W and Ga) of the Ga liquid metal ion source 2-1, if the back-sputtered particles 11 attach to the Ga liquid metal ion source 2-1, the contamination changing physical characteristics of the Ga9 does not occur.

Figure 4B:
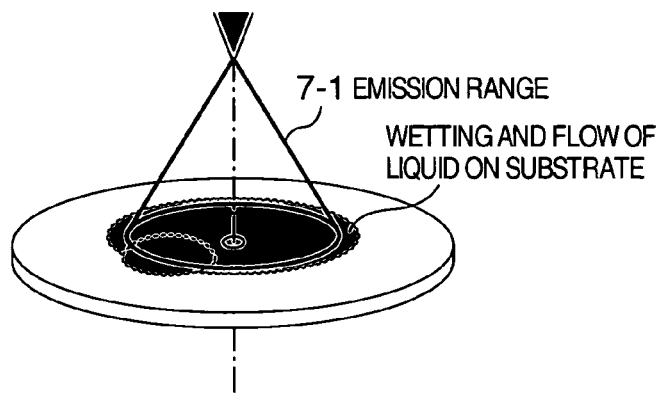

That is, a W aperture is used as the beam limiting (GUN) aperture 2-3, and Ga (melting point of 30° C.) of approx. 25 mg is put on a surface of a portion included in a beam emission region 7-1 (Ga store 10). When applying ions to the beam limiting (GUN) aperture 2-3, Ga in the emission region 7-1 melts and diffuses to the surface of the beam emission region of the W aperture (see FIG. 4B). Therefore, because the melting of Ga and the diffusion of Ga to the emission region spontaneously occur in accordance with the ion emission, it is unnecessary to previously apply Ga to the W aperture. As a result of changing the beam limiting aperture according to this embodiment from a general Sn beam limiting aperture to the above beam limiting aperture, it is possible to obtain a stable emission state for 1,200 hours (h).

Next, the aperture of the liquid metal ion gun is described below. When using general gallium as a liquid metal ion source, if assuming the distance L between the emitter apex of the Ga liquid metal ion gun and the beam limiting aperture as 7 mm, the mass m of Ga in a Ga store as 25 mg, the density $\rho$ of Ga as 5.93 g/cm$^3$, and the ion emission angle $\alpha$ as 20°, the aperture radius "r" of the W beam limiting aperture having the Ga store is shown by the following formula.

$$r \geq m/\rho\pi(L\alpha)^2$$

In this case, the aperture radius "r" is 0.23 mm.

Figure 5A:
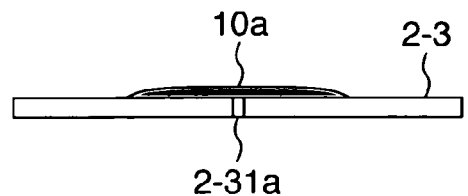
FIGS. 5A to 5C are illustrations showing a configuration example of a beam limiting aperture according to an embodiment of the present invention.
Figure 5B:
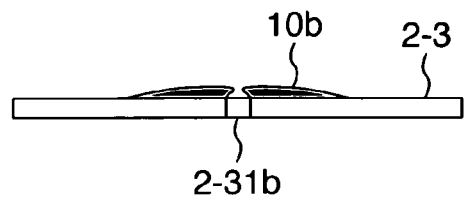
Figure 5C:
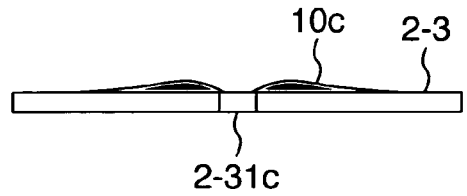

In the above formula, in the case that the cross section of the thickness of Ga is closed at an aperture portion (see FIG. 5A), this is because Ga protrudes from the aperture to a semicircle having the diameter equal to the thickness, and contacts at the opposing portion (see FIG. 5B), in the above condition, when the aperture actually having a diameter of φ0.3 mm, the aperture is immediately clogged, however, it has been known that an aperture having a diameter of φ0.6 mm is not easily clogged (see FIG. 5C). Therefore, a W beam limiting aperture including a Ga store having an aperture of φ0.6 mm is used.

Figure 6:
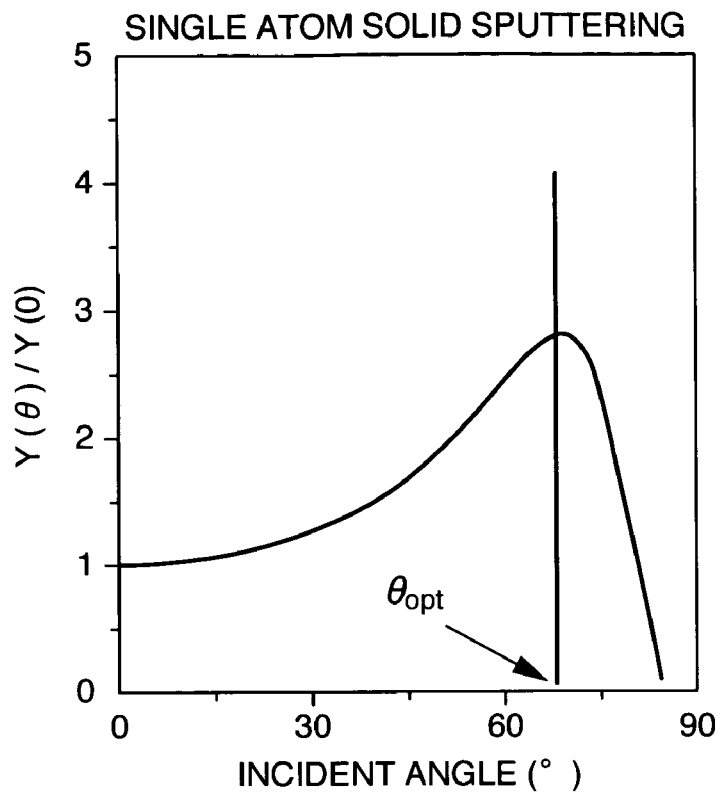
FIG. 6 is an illustration showing an example of incident angle dependency of a sputtering yield of a single-atom solid image pickup device.

Next, the angle dependency of a liquid metal ion gun is described. The processing speed (sputtering yield) by ions has an incident angle dependency. FIG. 6 shows a characteristic example about the incident angle dependency of the sputtering yield. As shown in FIG. 6, when the incident angle θ increases, a cascade occurs at more surface side. Therefore, it increases in accordance with the formula of $\cos^{-f} \theta$ (f=1 to 2) as shown by the principle of Sigmund. When the incident angle θ increases, the collision efficiency is limited by the shielding effect of adjacent atoms on the surface, and it does not easily pass through the surface. Finally, all of the incident ions are reflected almost without providing energy for a solid and the yield is suddenly decreased.

Moreover, in the case of the sputtering phenomenon, because sputtering speed differs due to the difference between crystal orientations of crystal particles, irregularity in which the crystal particle effects as a start point occurs. The surface irregularity is further encouraged due to the above irregularity and the incident angle dependency of the ion processing speed to increase the processing speed, so that the life time of a beam limiting aperture is shortened. However, the crystal particle diameter of W is approx. 1 μm and the crystal particle diameter of Sn regions between 6 and 10 μm. Therefore, the irregularity is not produced on W compared to the case of Sn. Moreover, the sputtering yield is small. Further, when using a W beam limiting aperture having a Ga store of the present invention, even if the irregularity of approx. 1 μm is formed, the surface becomes a mirror state because the surface is wetted by Ga, and the sputtering speed is not greatly changed even if using the beam limiting aperture for a long time.

In addition, since the surface is covered with Ga, even if sputtering of Ga occurs, sputtering of W does not easily occur. The W aperture does not subjected to the sputtering as long as Ga does not dry up, and thus, the beam limiting aperture can obtain a desired life time even if the W aperture is thin.

Figure 7A:
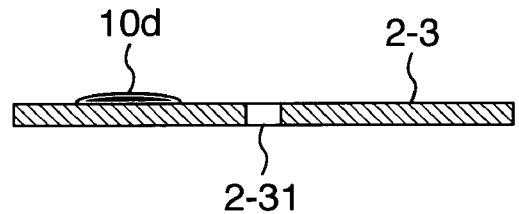
FIGS. 7A to 7C are illustrations showing a configuration example of a beam limiting aperture according to an embodiment of the present invention.
Figure 7B:
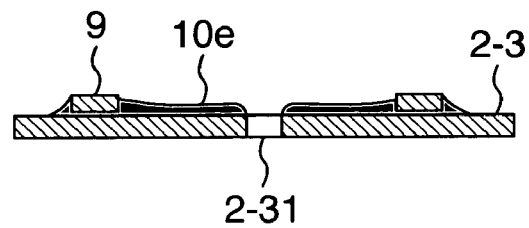
Figure 7C:
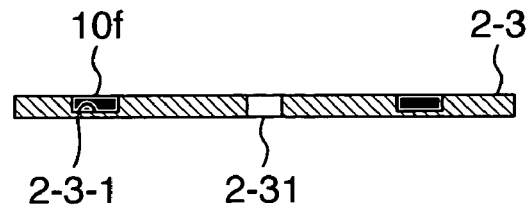

Next, a mounting state of the liquid metal ion gun is described. A Ga store 10d is formed by placing a lump of Ga on a surface of the W beam limiting aperture 2-3 having the aperture 2-31, melting the lump, and then solidifying it by bringing the W beam limiting aperture into a super cooled atmosphere at −20° C. (see to FIG. 7A). Also, it may be possible to adopt a configuration obtained by applying Ga10e to a ring-shaped W material or the W sintered body 9 set so as not to interrupt an ion emission region and putting it on the beam limiting aperture 2-3, or by sandwiching Ga between the ring-shaped W material or W sintered body 9 and the W beam limiting aperture 2-3 (FIG. 7B). Alternatively, by forming a concave portion, a concave groove 2-3-1 or the like on the surface of the W beam limiting aperture 2-3 in a region separated from the aperture 2-31 so that a Ga store 10f is easily formed, it is possible to store liquid Ga at a predetermined position even if Ga is melted to have fluidity.

W and Ga are good in wetting. However, when W becomes oxidized, it is not easily wetted. In order to obtain a clean W surface without oxide scum, the W beam limiting aperture is immersed in a hypochlorous acid Na solution for 1 hr. Alternatively, the surface of the W beam limiting aperture is cleaned through electropolishing using an electrolytic solution of NaOH or the like, and then ultrasonic-cleaned by deionized water.

By mounting the Ga liquid metal ion gun using a W beam limiting aperture having a Ga store on a system, when operating the ion gun at an ultimate vacuum degree of the gun of $10^{-7}$ Pa, it is possible to continuously keep a state where an extraction voltage is 7 kV and the emission is 2.4 μA for 120 hr, and to inhibit, for that time, a beam-focus-like-change without performing maintenance such as flashing or emission control.

As described above, when using the W beam limiting aperture of this embodiment, Ga as a liquid metal ion source is not contaminated even if Ga or W particles sputtered from the beam limiting aperture attach to an emitter. Therefore, even if putting the beam limiting aperture near the Ga liquid metal ion source, it is possible to maintain a stable emission state for a long period.

Further, according to the W beam limiting aperture of this embodiment, an ion emission region is wetted by Ga, W is not exposed, Ga is mainly sputtered by ion emission, and contamination is not caused even if back-sputtered particles attach to a liquid metal ion source. As a result thereof, the emission change is restrained. Moreover, when an element (W base material) of a beam limiting aperture is exposed by receiving ion emission for a long time, the W base material may be sputtered. In this case, the emission is decreased even if W is sputtered and attached to and mixed in Ga liquid metal source, however, since wettabilities of W and Ga are good, W is covered with Ga by flashing (emitter is temporarily heated) and the recovery of emission is easy.

In addition to this, oxidation of Ga is considered as contamination of a Ga liquid metal ion source. However, when the environment clean vacuum is $10^{-6}$ Pa, emission is stable for several days and is decreased in accordance with advance of the oxidation of Ga because the oxidation also is advanced at the same time. However, reproducibility of oxidized Ga is improved by performing flashing (heating) at approx. 700° C. for approx. 30 sec, and it is possible to recover an emission state (emission current, necessary extraction voltage, and stability).

Further, if when the environment clean vacuum is in the order of $10^{-7}$ Pa, the emission is stable for several days without changing the emission condition of an extraction voltage or the like, and thus, lens functions of an ion optical system are not changed. Therefore, it is possible to perform ion processing even if focus adjustment is not performed for several days, and the stability and operability of the system are extremely improved.

If a Ga store exists in at least a part in the beam emission region of a beam limiting aperture, Ga is voluntarily diffused in the beam emission region of the beam limiting aperture to wet there. Therefore, the beam emission region of the beam limiting aperture becomes a mirror state of Ga free from irregularity. Therefore, the angle dependency of sputtering is minimized and the life time is lengthened. Moreover, sputtering of Ga is mainly performed on the surface of the beam limiting aperture, and sputtering of W is almost eliminated. Therefore, it is possible to provide a long life time even if the beam limiting aperture is thin.

Moreover, when decreasing the beam limiting aperture in thickness, the number of beams scattered on a sidewall of the beam limiting aperture is decreased and thus, it is possible to apply a beam of which direction is aligned with that of energy to the downstream side of the beam limiting aperture. Therefore, in processing by a large current beam of a focused ion beam system, it is possible to perform processing with no damage by ion emission around processing. Particularly, according to a liquid metal ion gun using the W beam limiting aperture of this embodiment, in a liquid metal ion source to be used for hundreds of hours, it is superior in the point of stably maintaining emission for a long time and in the point of securely recovering unstable emission to stable emission, that is, easiness and reproducibility of recovery of emission stability.

The present invention is particularly effective when long-time processing is necessary. Moreover, because the maintenance is easy, the present invention has a high usability in a large-scale production line.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A liquid metal ion gun comprising:
   a liquid metal ion source having a liquid metal ion element made of a first metal substrate, a reservoir formed by a second metal substrate for holding said liquid metal ion element, and an emitter formed by said second metal substrate; and
   a beam limiting aperture formed by a third metal substrate, the beam limiting aperture having an aperture for limiting emission of an ion beam extracted from said liquid metal ion source, wherein
   said third metal substrate is formed by a material including the metal substrates constituting said first metal substrate and said second metal substrate, respectively.

2. The liquid metal ion gun according to claim 1, comprising:
   a liquid metal ion source having a liquid metal ion element made of a first metal substrate, a reservoir formed by as second metal substrate for holding said liquid metal ion element, and an emitter formed by said second metal substrate; and
   a beam limiting aperture formed by a third metal substrate, the beam limiting aperture having an aperture for limiting emission of an ion beam extracted from said liquid metal ion source, wherein
   said beam limiting aperture is formed by a material including said second metal substrate, and a supply source of the first metal substrate is arranged in at least a part of a region to which said ion beam is substantially emitted.

3. The liquid metal ion gun according to claim 1, wherein when said first metal substrate is gallium, said beam limiting aperture is formed by tungsten (W), and a gallium (Ga) store is arranged in at least a part of a region to which said ion beam is substantially emitted in said beam limiting aperture.

4. The liquid metal ion gun according to claim 3, wherein the opening radius "r" of said W beam limiting aperture is set so as to satisfy $r \geq m/\rho\pi(L\alpha)^2$ wherein "L" is the distance between a tip end of said emitter and said beam limiting aperture,
"m" is the mass of Ga in the Ga store,
"ρ" is the density of G, and
"α" is the ion emission angle.

5. The liquid metal ion gun according to claim 3, wherein said Ga store is formed by wetting a surface of said W beam limiting aperture with liquid Ga and then solidifying it.

6. The liquid metal ion gun according to claim 3, further comprising:
   a W material arranged on said W beam limiting aperture, wherein
   said Ga store is provided by a structure in which liquid Ga is sandwiched by immersing it between said W beam limiting aperture and said W material.

7. A beam limiting aperture for use in a liquid metal ion gun comprising an aperture and formed by W, wherein
   a Ga store is arranged in at least a part of a region of a surface of the beam limiting aperture.

8. An ion beam apparatus comprising:
   a vacuum chamber,
   a A liquid metal ion gun comprising: a liquid metal ion source having a liquid metal ion element made of a first metal substrate, a reservoir formed by as second metal substrate for holding said liquid metal ion element, and an emitter formed by said second metal substrate; and a beam limiting aperture formed by a third metal substrate, the beam limiting aperture having an aperture for limiting emission of an ion beam extracted from said liquid metal ion source, wherein said third metal substrate is formed by a material including the metal substrates constituting said first metal substrate and said second metal substrate, respectively; and
   an acceleration electrode for accelerating the ion beam having passed through said aperture.

* * * * *